US009494809B2

(12) United States Patent
Yamada et al.

(10) Patent No.: US 9,494,809 B2
(45) Date of Patent: Nov. 15, 2016

(54) ULTRASENSITIVE MAGNETIC SENSOR WITH MAGNETO-OPTICALLY ACTIVE MATERIAL WITH HIGH VERDET CONSTANT

(71) Applicants: Hitoshi Yamada, Aichi-gun (JP); Kazuhiro Shintani, Toyokawa (JP); Akinobu Fujii, Nagoya (JP); Norio Sato, Nagoya (JP); Thierry Verbiest, Leuven (BE); Andre Persoons, Holsbeek (BE); Pavel Polynkin, Tucson, AZ (US); Nasser Peyghambarian, Tucson, AZ (US)

(72) Inventors: Hitoshi Yamada, Aichi-gun (JP); Kazuhiro Shintani, Toyokawa (JP); Akinobu Fujii, Nagoya (JP); Norio Sato, Nagoya (JP); Thierry Verbiest, Leuven (BE); Andre Persoons, Holsbeek (BE); Pavel Polynkin, Tucson, AZ (US); Nasser Peyghambarian, Tucson, AZ (US)

(73) Assignees: TOYOTA JIDOSHA KABUSHIKI KAISHA, Toyota-Shi (JP); KATHOLIEKE UNIVERSITEIT LEUVEN, Leuven (BE)

( * ) Notice: Subject to any disclaimer, the term of this patent is extended or adjusted under 35 U.S.C. 154(b) by 143 days.

(21) Appl. No.: 14/012,207

(22) Filed: Aug. 28, 2013

(65) Prior Publication Data

US 2014/0070802 A1 Mar. 13, 2014

Related U.S. Application Data

(62) Division of application No. 12/745,343, filed as application No. PCT/US2009/031313 on Jan. 16, 2009, now Pat. No. 8,575,927.

(51) Int. Cl.
*G01R 33/02* (2006.01)
*G02F 1/00* (2006.01)
*G01R 33/032* (2006.01)

(52) U.S. Cl.
CPC ........... *G02F 1/0036* (2013.01); *G01R 33/032* (2013.01); *G01R 33/0322* (2013.01)

(58) Field of Classification Search
CPC ........... G01R 33/032; G01R 33/0322; G02F 1/0036
USPC ....................................... 324/244.1
See application file for complete search history.

(56) References Cited

U.S. PATENT DOCUMENTS 4,563,646 A * 1/1986 Desormiere ............ H01S 3/102 324/244.1
5,053,617 A * 10/1991 Kakizaki et al. ........ 250/227.21

(Continued)

FOREIGN PATENT DOCUMENTS

JP 60-104271 A 6/1985
JP 03084483 A 4/1991

(Continued)

OTHER PUBLICATIONS

Partial translation of Office Action issued on Oct. 2, 2012 in JP 2010-546808.

(Continued)

*Primary Examiner* — Jay Patidar
(74) *Attorney, Agent, or Firm* — Andrews Kurth Kenyon LLP

(57) ABSTRACT

A high-resolution sensor of magnetic field sensor system and materials for use in such a system are described. The sensor systems measure a magnetic field using inorganic and/or organic magneto-optically active materials, e.g. polymer material and have an interferometer based on Faraday rotation. The polymer material is preferably in the form of a film. The polymer material has an optical property that is sensitive to the magnetic field, e g the Faraday rotation effect. The present invention also provides a sensor head structure comprising the above polymer material. The sensor head may be designed for use with an optical fiber or with mirrors In particular the present invention provides a fiber Sagnac interferometer to measure the rotation of polarized plane of light. The present invention provides a fiber or mirror based Sagnac interferometer with passive phase bias applied to magnetic field sensing.

5 Claims, 5 Drawing Sheets

(56) References Cited

U.S. PATENT DOCUMENTS

| | | | |
|---|---|---|---|
| 5,364,819 A * | 11/1994 | Dexter et al. ............... 501/45 |
| 5,644,397 A | 7/1997 | Blake | |
| 5,933,000 A | 8/1999 | Bosselmann et al. | |
| 5,953,121 A | 9/1999 | Bohnert et al. | |
| 5,963,034 A | 10/1999 | Mahapatra et al. | |
| 6,437,885 B1 | 8/2002 | Duncan | |
| 6,441,395 B1 | 8/2002 | Yu et al. | |
| 7,071,687 B2 | 7/2006 | Sekijima et al. | |
| 8,575,927 B2 | 11/2013 | Yamada et al. | |
| 2002/0027659 A1 | 3/2002 | Dyott | |
| 2003/0133657 A1 | 7/2003 | Kochergin et al. | |
| 2003/0224214 A1 | 12/2003 | Garito et al. | |
| 2006/0014099 A1 | 1/2006 | Faler et al. | |
| 2006/0103380 A1 * | 5/2006 | Kochergin et al. ........ 324/244.1 |

FOREIGN PATENT DOCUMENTS

| | | |
|---|---|---|
| JP | 04-097915 A | 3/1992 |
| JP | 2002-502128 A | 1/2002 |
| JP | 2002-528707 A | 9/2002 |
| WO | 99/39394 A1 | 8/1999 |
| WO | 2008025962 A1 | 3/2008 |

OTHER PUBLICATIONS

P. Gangopadhyay, et al.: Efficient Faraday rotation in conjugated polymers, Proc. of SPIE, vol. 6331 (2006), 5 pages.

Guy Koeckelberghs, et al.: Regioregularity in Poly(3-alkoxythiophene)s: Effects on the Faraday Rotation and Polymerization Mechanism, macromol. Rapid commun. Wiley-VCH Verlag Gmbh & Co., KGaA, Aug. 10, 2006, 6 pages.

R. T. de Carvalho, et al.: Sagnac interferometers for accurate measurements of true nonreciprocal effects, SPIE, vol. 2070, Fiber Optics and Laser Sensors, downloaded SPIE Digital Library on Mar. 23, 2010; 6 pages.

J. Blake, et al.: In-Line Sagnac Interferometer Current Sensor, IEEE Transactions on Power Delivery, vol. 11, No. 1, Jan. 1996, pp. 116-121.

Guido Frosio, et al.: Reciprocal reflection interferometer for a fiber-optic Faraday current sensor, Applied Optics, Sep. 1, 1994, vol. 33, No. 25, pp. 6111-6122.

T. Kaino et al., "Ultrafast Nonlinear Optical Switches," Japan Telecommunication Review, Telecommunications Association, Tokyo, JP, vol. 7, No. 5, Sep. 1, 1995, pp. 47-56.

H. Ma et al., "Polymer-Based Optical Waveguides: Materials, Processing, and Devices," Advanced Materials, Wiley VCH Verlag GmbH & Co, KGaA, Germany, vol. 14, No. 19, Oct. 2, 2002, pp. 1339-1365.

F. Saito, "Femtosecond Technology Project—its General Objectives, Goals and Operation," Lasers and Electro-Optics, 1997, CLEO/Pacific Rim '97, Pacific Rim Conference on Chiba, Japan, Jul. 14-18, 1997, New York, NY, USA, IEEE, US, Jul. 14, 1997, pp. 108-109.

Partial Translation of Notification of Reasons for Refusal issued Oct. 2, 2012 in Japanese Application No. 2010-546808.

Office Action dated Feb. 19, 2013 in U.S. Appl. No. 12/745,343.

Yu, H.C.Y. et al., "Enhanced magneto-optical effect in cobalt nanoparticle-doped optical fiber," Applied Optics, Optical Society of America, Washington, DC, US, vol. 47, No. 35, Dec. 10, 2008, pp. 6497-6501.

\* cited by examiner

ULTRASENSITIVE MAGNETIC SENSOR WITH MAGNETO-OPTICALLY ACTIVE MATERIAL WITH HIGH VERDET CONSTANT

CROSS REFERENCE

This application is a divisional of U.S. application Ser. No. 12/745,343, entitled "Ultrasensitive Magnetic Sensor with Magneto-Optically Active Material with High Verdet Constant", filed on May 28, 2010, which is a 371 national phase application of PCT/US2009/031313 filed Jan. 16, 2009, the contents of which are incorporated herein by reference.

FIELD OF THE INVENTION

The present invention relates to a high-resolution sensor of electromagnetic field as well as to methods of constructing the same. In particular the present invention relates to a high-resolution sensor of magnetic field as well as to methods of constructing the same, e.g., that can also be used for the measurement of electric current and also electric fields.

BACKGROUND OF THE INVENTION

The measurement of very small magnetic fields is very important for biomedical research, e.g., for MCG (magneto-Cardiogram, fields smaller than 1 nanoTesla) and for MEG (Magneto-Encephalogram, fields smaller than 10 picoTesla). Currently these magnetic fields are measured with SQUID devices—Superconducting Quantum Interference Devices (SQUID) are very sensitive magnetometers used to measure extremely small magnetic fields (up to femtoTesla). These SQUID devices are only working at cryogenic temperatures and are extremely expensive, prohibiting their use in current medical practice.

The working principle Faraday rotation is shown schematically in FIG. 1. Faraday rotation is the rotation of the polarization plane of linearly polarized light due to magnetic field induced birefringence by a magnetic field parallel with the direction of light propagation. Faraday rotation has been known for more than hundred years and is commonly used in optical isolators. The rotation of the polarization plane (A) is given by the product of the magnitude of the magnetic field (B), the sample length (L) and the Verdet constant (V): $\theta=VBL$. The Verdet constant, which quantifies the Faraday effect, is for all materials different from zero and strongly wavelength dependent.

The principles of operation of a Sagnac interferometer are described in "The optical fibre Sagnac interferometer: an overview of its principles and applications", B. Colshaw, Inst. of Physics Publishing, Meas. Sci. Technol. Vol. 17, (2006) R1-R16.

The article by Jing Xia, et al. entitled "Modified Sagnac interferometer for high-sensitivity magneto-optic measurements at cryogenic temperatures", Appl. Phys. Letters, vol. 89, 06258 (2006) describes a zero-area Sagnac interferometer loop for measuring the magneto-optic Kerr effect at cryogenic temperatures. A beam of light from a broadband source is routed by a fiber to a polarizer and from there to a half-wave plate and an electro-optic modulator and from there to a fiber. The light emitted from the end of the fiber is reflected off the sample which is maintained at cryogenic temperatures.

The most common way of constructing a fiber Sagnac interferometer is by using the lock-in detection based modulator-demodulator scheme. The detection bandwidth of the lock-in scheme is limited by the modulation frequency, and this scheme requires costly optical and electronic components such as fiber-pigtailed optical phase modulator and a lock-in amplifier.

MEMS-based magnetometers are known that are used to measure relatively strong magnetic fields above microTesla level, and ultra-sensitive spectroscopy-based devices and SQUIDS. The MEMS magnetometers are extremely compact and inexpensive, but their sensitivity is limited. They are not suitable for biomedical applications. In addition, MEMS magnetometers are sensitive to effects of electromagnetic interference.

Atomic magnetometers (such as optically pumped magnetometers) have sensitivity of up to a picoTesla, but they are very fragile and expensive. They utilize several narrow-line, stabilized single-frequency laser sources for interrogation of atomic transitions in gas cells. SQUIDs that presently have the highest sensitivity of all magnetometer types are very expensive and impractical as they have to be operated at cryogenic temperatures.

SUMMARY OF THE INVENTION

The present invention provides a sensor system, an inorganic and/or organic magneto-optically active probe, inorganic and/or organic magneto-optically active materials, an inorganic and/or organic magneto-optically active film and methods of making the same as defined in the attached claims. These are described in more detail in the description with reference to the drawings.

The present invention provides a magnetic sensor system and materials for use in such a system. Sensor systems according to the present invention measure a magnetic field using inorganic and/or organic magneto-optically active materials, e.g., polymer material and have an interferometer based on Faraday rotation. The polymer material is preferably in the form of a film. The polymer material has an optical property that is sensitive to the magnetic field, e.g., the Faraday rotation effect.

The present invention also provides a sensor head structure comprising the above polymer material. The sensor head may be designed for use with an optical fiber or with mirrors. The present invention provides a magnetic sensor probe comprising:

an inlet for coupling in light, an outlet for coupling out light, an inorganic and/or organic magneto-optically active film which is arranged to transmit the light received by the magnetic sensor probe, and optical components to direct the light from the inlet, through the inorganic and/or organic magneto-optically active film to the outlet.

In particular the present invention provides a fiber Sagnac interferometer to measure the rotation of polarized plane of light. The present invention provides a fiber or mirror based Sagnac interferometer with passive phase bias applied to magnetic field sensing.

This invention has the following three major aspects each being an embodiment of the present invention:

1. Sensing material: a conjugate polymer such as polythiophene and/or a polymer containing superparamagnetic nanoparticles that exhibits a giant Faraday rotation.
2. Magnetic field probe that incorporates the above polymer or polymer/nanoparticle composite, e.g. in the form of a film.
3. Sensor: The sensor combines an optical fiber-based Sagnac interferometer and the above magnetic field probe.

In the sensor, polarized light is guided to the polymer-based probe. The polymer-based probe may be a polymer magnetic-field probe. The polarized light may be guided by an optical fiber or by other optical means, e.g., by use of at least one mirror. After passing through the polymer, the light is guided to a detector. The light may be incident at 90° to the polymer film or it may be incident at an angle thereto. The light from the polymer may be guided by the same or a different optical fiber or by other optical means, e.g., by use of at least one mirror. A preferred embodiment of the sensor includes an interferometer of which an in-line Sagnac-type interferometer is one suitable type. In a preferred embodiment, the light is delivered to the polymer probe by the same fiber that carries light back to the detector. The magnetic field to be measured causes the polarization rotation of light in the magnetic-field probe, which is converted into the intensity variation in the detector, by the interferometer, e.g., Sagnac interferometer.

The sensitivity of a sensor according to the present invention can be in the nanoTesla range. With a probe based on an improved polymers or polymer/nanoparticle composites, as described with respect to this invention, the resolution can reach the femtoTesla range.

Accordingly, the present invention provides for an ultra-sensitive magnetometer for measurement of magnetic field strength, e.g., at and below the nanoTesla range and at or below the femtoTesla range. This sensor can be used for robotic and monitoring applications in various technology and biomedical fields. A principle of operation of the device is based on the Giant Faraday Effect in films with a high Verdet constant. In embodiments of this invention, conjugated polymers and polymer/nanoparticle blends are used as a material with high Verdet constant. The films may be made, for example, of conjugated polymers or composites of polymers and superparamagnetic nanoparticles. The polymers need not be limited to only polythiophene-based polymers. For example, the conjugated polymer can be poly(acetylene), poly(pyrrole), poly(aniline), poly(fluorene), poly(thiophene), polytetrathiafulvalenes, polynaphthalenes, poly(p-phenylene sulphide), poly(para-phenylene vinylene), polyalkoxythiophene.

Other polymer films incorporating superparamagnetic nanoparticles of magnetic metal-oxide composites can also be utilized. The amount of superparamagnetic particles in the polymer can range from 0.1 to 50 wt %, e.g. 1-10 wt %. The polymer forming the matrix can be any suitable transparent polymer such as PMMA, polyethylene, polypropylene, polycarbonate, ABS, PVC, PVA, polyimide, polystyrene, etc., or a conjugate polymer as described with reference to this invention. In addition, polymers containing superparamagnetic nanoparticles can be poled by an external magnetic field to enhance the Verdet constant and reduce optical loss. The amount of Faraday rotation is proportional to the magnetic field strength and is measured using an interferometer. In one embodiment an in-line fiber Sagnac interferometer is used. This interferometer may comprise, for example, an LED, or a superluminescent diode or laser diode as a light source. In a preferred embodiment of the sensor, the shot-noise limited resolution of the sensor is in the 1 pT/sqrt(Hz) range. The sensitivity limit can be improved by implementing a magnetic field concentrator, a well-known technique in the art.

DETAILED DESCRIPTION

The present invention provides methods, devices and materials for the measurement of very small magnetic fields, e.g., for use in biomedical research, e.g., for MCG (magneto-Cardiogram), e.g., to measure magnetic fields smaller than 1 nanoTesla, and/or for MEG (Magneto-Encephalogram), e.g., to measure fields smaller than 10 picoTesla. The present invention provides very sensitive magnetometers and methods of use to measure extremely small magnetic fields, e.g., down to nanoTesla or down to femtoTesla. The devices according to the present invention can work at room temperature, e.g., below 200° C. They may also be operated at lower temperatures, e.g., at cryogenic temperatures.

Embodiments of the present invention have advantage that they allow the measurement of extremely weak magnetic fields at room temperature in a very simple way. The magnetic sensor, based upon new materials, is easy to manufacture, low cost and can be integrated in a complete system to measure biomagnetism. Since the measurement is based upon the Faraday rotation effect, an optical effect, it is not sensitive to electric interference and would compensate for the magnetic field of the earth, a major problem in measurement of very small magnetic fields.

In accordance with one aspect of the present invention, a structure of a fiber-tip sensor is provided. The structure can be of the one fiber type or two-fiber type which represent two preferred embodiments of the magnetic-field probe.

Figure 1:
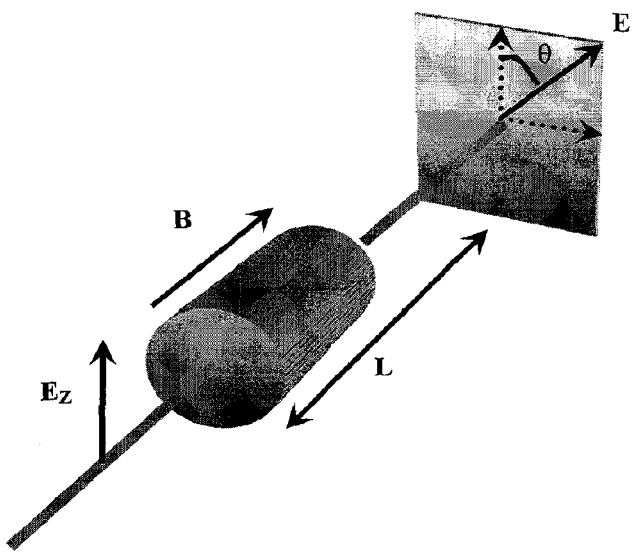
FIG. 1 shows schematically the effect of Faraday rotation.
Figure 2:
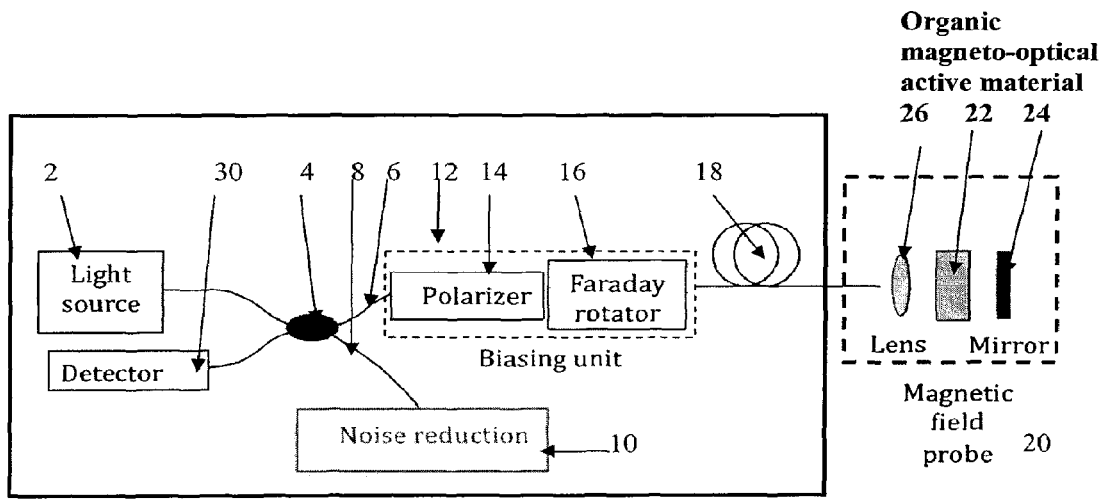
FIG. 2 shows schematically an embodiment of a sensor in accordance with the present invention.

FIG. 2 shows schematically a one fiber embodiment of a sensor in accordance with the present invention. FIG. 2 shows a particular embodiment of the present invention in the form of an in-line fiber Sagnac interferometer. As a light source 2 typically an LED with broad optical spectrum is used, e.g. 1.5 µm LED can be used as the light source 2. The output light from a light source 2 is split into two fiber branches 6, 8, e.g., using a standard fused fiber splitter 4. One of the output arms 6 is selected for delivery of the light to the magnetic-field probe 20. The other half 8 is typically lost, but may be used for noise subtraction 10 in order to improve the noise performance. In the sensing arm 6, the light passes through the biasing unit 12 and reaches the magnetic field probe 20. The biasing unit 12 may include a polarizer 14 and a Faraday rotator 16. From the biasing unit 12 the light travels along a further fiber and exits into the probe unit 20. The probe unit 20 incorporates a sensing polymer film 22 with a high Verdet value and optionally a mirror 24. Optionally a lens 26 can be provided to shape the light beam onto the sensing film 22. The light passes through the sensing film 22 and is optionally reflected by the mirror 24. The light may be incident at 90° to the polymer film or it may be incident at an angle thereto. A measurement principle of embodiments of the present invention is transmission through a film material with a high Verdet constant that is magneto-optically active and sufficiently transparent. After passing through the sensing film 22 twice and reflecting off the mirror 24, light with rotated polarization travels through the same fiber 18 as on the way towards the probe 20. After passing through the fiber splitter 4, the intensity of light is detected using a photodetector 30 with associated read-out electronics (not shown). The polarization rotation in the magnetic-field probe 20 is converted into intensity variation by the polarizer which is incorporated in the biasing unit 12. An additional (and very important) purpose of the biasing unit 12 is to create the phase bias necessary for detection. Without the bias, the response of this system to polarization rotation would be proportional to the cosine function of the rotation angle. Since Faraday rotation is in generally very small, a cosine function-type response will result in even smaller variations of the detected intensity (~rotation angle squared). The passive bias adds a large fixed angle to the Faraday rotation. This large angle typically equals 90 degrees, but may be chosen to be different. If the bias angle is 90 degrees, the cosine response is converted to the sine response, which is proportional to the polarization rotation angle, suitable for detecting small rotation angles.

Accordingly, the present invention is based on detection of rotation of the polarization of light after passing through a sensing material, e.g., film, under the influence of a magnetic field. The sensing material in the sensing film is affected by the magnetic field. A measurement principle of embodiments of the present invention is transmission through a film material with a high Verdet constant, i.e. the sensing material has a high Verdet constant. The sensing material is preferably in the form of a film, i.e., its thickness in the direction of the optical path is less than its size in a direction perpendicular to the optical path. The thickness of the sensing polymer film will influence the resolution of the device. The thickness of the material and the Verdet constant will also affect the transparency of the sensing film. Preferably, the thickness of the film is less than 1 cm, more preferably less than 1 mm and most preferably of the order of 10 microns. In embodiments of the present invention, the sensing material can be a conjugated polymer or a blend of a polymer with superparamagnetic nanoparticles. These materials show a very high Faraday rotation, indicated by their high Verdet constant (e.g., >$10^6$°/Tm) while still maintaining some transparency.

Figure 3:
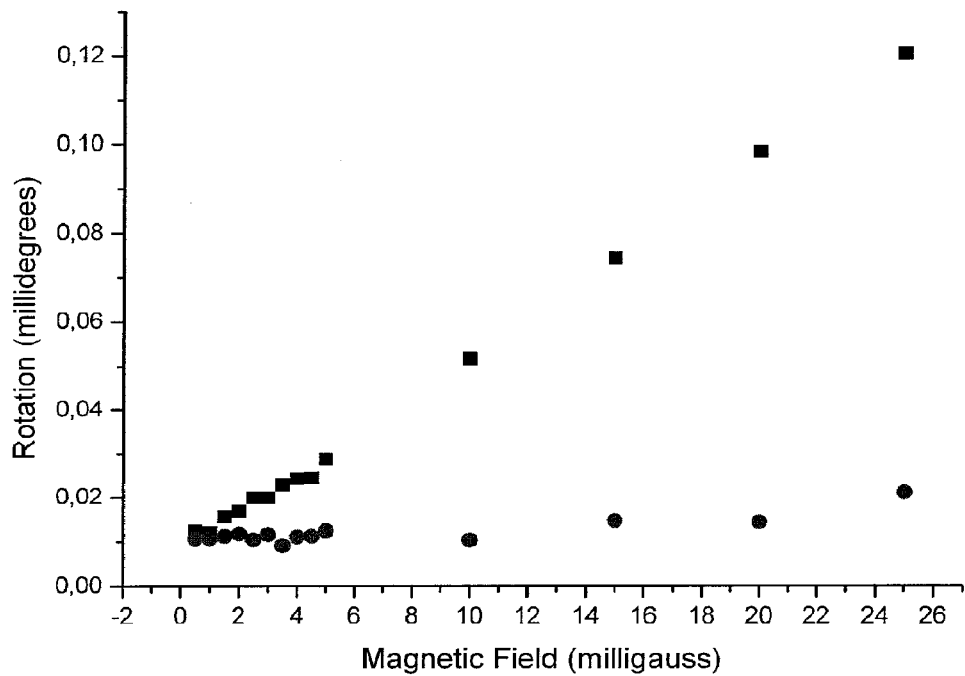
FIG. 3 shows results obtained with sensing materials according to embodiments of the present invention.

Measurement results are shown in FIG. 3 for a nanoparticle/polymer blend according to an embodiment of the present invention. The lower line of round dots in the figure is a measurement series without such material, while the upper inclined line of square dots is a measurement series with a nanoparticle/polymer blend according to an embodiment of the present invention. As one can see the latter is extremely sensitive to a change in magnetic field. Since interferometers such as a fiber Sagnac interferometer is able to detect rotations of microdegrees, one can see that the sensitivity in terms of magnetic fields is very high. In fact, depending on the materials used, sensitivities on the order of $10^{-15}$ T can be achieved.

The optical circuit can be built using telecom-grade fiber-optic components. If known inorganic materials with high Verdet constant are used for the sensing film, the resolution of the device is down to 10 nanoTesla, which makes it useable for various robotic and monitoring applications. As such the sensor can be used as a low-cost monitoring device for surge detection in high-voltage electric power lines. Noise reduction schemes and material with high Verdet constants can substantially improve the sensitivity, down to $10^{-15}$ T.

A preferred embodiment of the present invention comprises a sensor as follows. The sensor utilizes the in-line fiber-based Sagnac interferometer that is schematically shown in the FIG. 2. The major components of the interferometer are the light source 2 (fiber-pigtailed LED), a fully spliced fiber-optic circuit, a photodetector 20 and detection electronics. The sensor is powered by a standard +/−12V electric power supply or a battery. The magnetic-field probe 20 can be based on inorganic materials, e.g., a stack of 500 μm thick BIG crystals or more preferably on the organic sensing film materials of embodiments of the present invention. The voltage output of the device is proportional to the magnetic field at the location of the probe 20. Two electrical outputs are available: DC- and AC-coupled. The AC-coupled output has an additional 50× gain. The sensor can operate at frequencies up to 10 kHz (DC or AC coupled), and has a demonstrated sensitivity of less than 10 nT, e.g., down to 10 femtoT. A much higher sensitivity can be achieved by replacing the BIG-based magnetic probe with that based on an organic magneto-optical organic material such as a magneto-optic polymer or polymer/nanoparticle composite in accordance with embodiments of the present invention.

Figure 4:
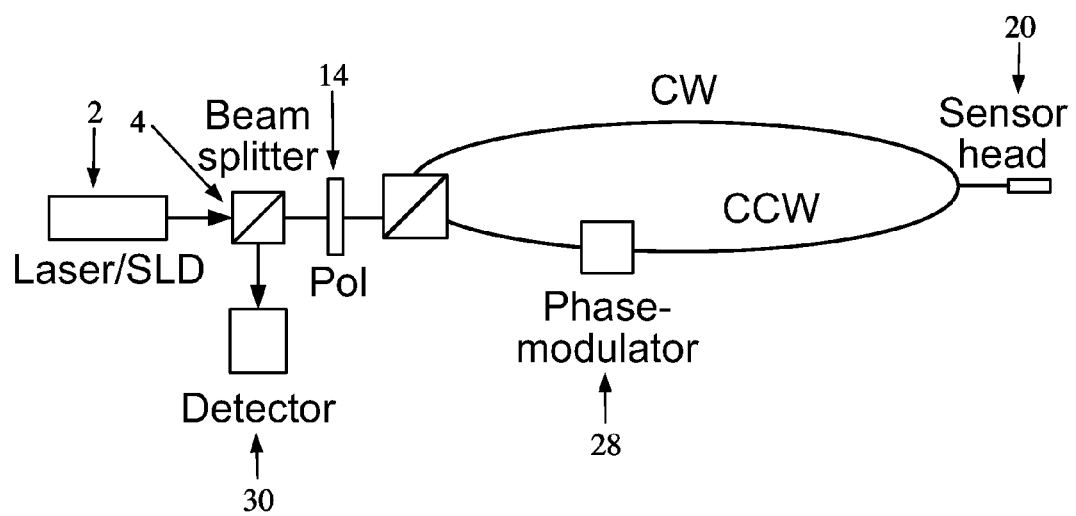
FIG. 4 shows schematically a further embodiment of a sensor in accordance with the present invention.

A two-fiber embodiment is shown schematically in FIG. 4. The light that travels in a first fiber from the light source 2 is directed though a beam splitter 4, a polarizer 14 to a sensing film made of high-Verdet material such as high-Verdet polymer or a polymer/nanoparticle composite which is located in the sensor head 20 as described with reference to FIG. 2. The measurement principle of embodiments of the present invention is transmission through a film material with a high Verdet constant. After passing through the sensing film twice and being reflected off a mirror, the light is coupled into a second output fiber. Preferably, polarization preservation is maintained in both input and output fibers. The returning signal is sent by the splitter 4 to a detector 30. A phase modulator 28 can be used. The polarization rotation in the magnetic-field probe 20 is converted into intensity variation by the polarizer 14. As described for previous embodiments the thickness of the sensing polymer film will influence the resolution of the device and the transparency of the film.

Figure 8:
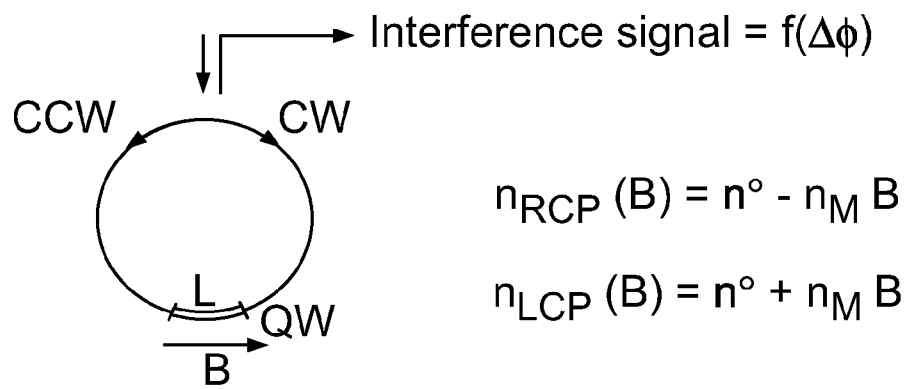
FIG. 8 illustrates the Faraday rotation for a fiber Sagnac interferometer according to the present invention.

The interferometer system shown in FIG. 2 or 4 measures the non-reciprocal phase shift that is accumulated as the lightwave travels though the fiber-optic circuit. The sensor detects the non-reciprocal phase shift due to the Faraday rotation in the sensing element, by converting this shift into polarization rotation. When this non-reciprocal shift is due to Faraday rotation in the polymer probe (passing twice), it is given by the formula (see FIG. 8 passing once):

$$\Delta\phi=4VLB$$

where V is the Verdet constant of the polymer material, L is the length of the magnetic field probe, and B is the strength of the field to be measured. The non-reciprocal phase shift is proportional to the external magnetic field. The relation is given by the formula on page 8. Naturally, the higher the Verdet constant of the field probe is, the weaker the magnetic field the sensor is capable of detecting. The minimum value of the field that the sensor is capable of detecting is thus proportional to the minimum detectable non-reciprocal phase shift. This minimum phase is typically limited by the shot noise at the receiver and is of the order of $10^{-8}$ radians per square-root Hz. Various known schemes have been developed in order to push this sensitivity limit below $10^{-9}$ radians per square-root Hz, if required by application; these techniques typically rely on subtraction of the source intensity noise from the signal. At the $10^{-8}$ phase sensitivity level, the estimated sensitivity of the sensor to magnetic field is of the order of 100 femto-Tesla per square-root Hz or lower, assuming that the magnetic-field probe is up to 2 cm-long and the Verdet constant of the polymer is $10^{6°}$/Tm or higher, e.g., $10^{7°}$/Tm. Even higher sensitivity can be achieved by improving the phase resolution of the interferometer by known noise-subtraction techniques such as described in P. Polynkin, J. de Arruda, J. Blake, "All-optical noise subtraction scheme for fiber optic gyroscope", Optics Letters, vol. 25, p. 147 (2000), or by using longer magnetic-field probe.

Note that the Sagnac interferometer itself detects the phase shift, not magnetic field. The minimum shift that can be detected is limited by the shot noise performance, and the detection bandwidth. The shot noise depends on the total optical power that reaches the detector. With ~1 mW of optical power and detection bandwidth of 1 Hz, the shot noise limits the minimal detectable phase by ~$10^{-8}$ radians.

Sagnac interferometer sensors according to embodiments of the present invention can make used of a passive DC-phase bias that is introduced by means of an integrated fiber-pigtailed Faraday rotator 16. Compared to the conventional phase modulation-demodulation technique used for introducing the bias, this approach simplifies the optical circuit and the signal processing electronics, and thus reduces the fabrication costs substantially. Embodiments of the present invention can routinely measure magnetic fields of the order of 10 microgauss using a Bi:YIG garnet probe, e.g., up to 500 mm-thick. Another desirable feature of the sensor is that the electronic part is based on low-power components.

Figure 5A:
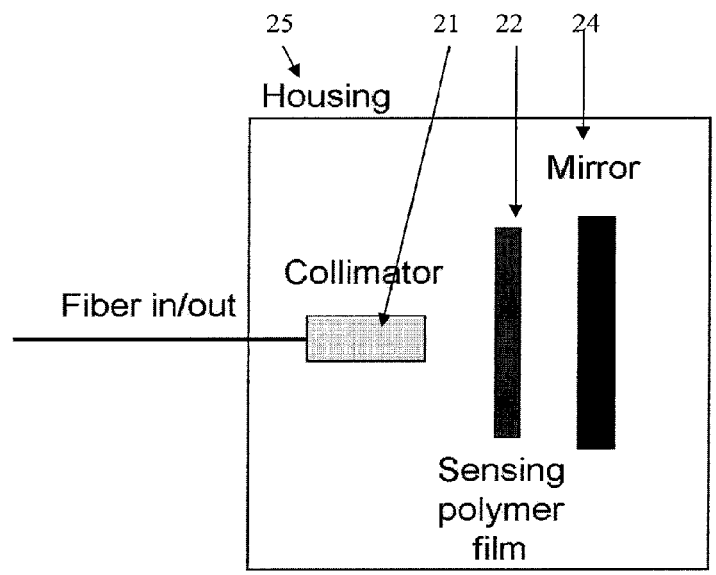
FIG. 5a shows schematically an embodiment of a sensor probe in accordance with the present invention and FIG. 5b shows a sensor with which this probe can be used.
Figure 5B:
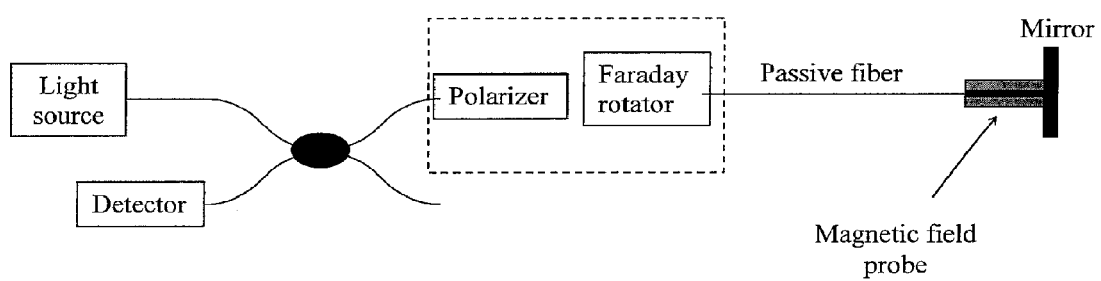
Figure 6:
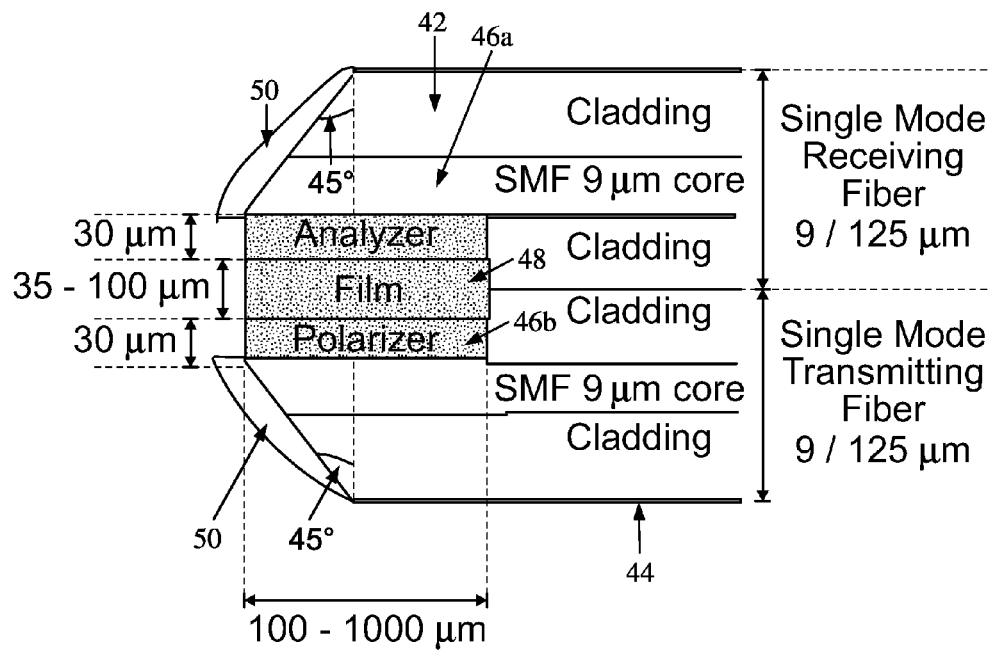
FIG. 6 shows schematically a further embodiment of a sensor probe in accordance with the present invention.

An embodiment of the present invention relates to an integrated magnetic-field probe based on a magneto-optical organic film such as a magneto-optical polymer film made from e.g. a magneto-optic polymer or a polymer/nanoparticle composite. Compared to BIG and YIG films, the polymer-based probes have a potential for orders-of-magnitude higher sensitivity and can be more economical. In addition, the polymer-based materials as described in embodiments of the present invention can be processed into thin films and integrated into waveguide-type magnetic-field probes, providing for high levels of system integration Particular embodiments of the magnetic-field probe 20 are shown in FIGS. 5 and 6. The embodiment of FIG. 5a can be integrated with the in-line fiber Sagnac interferometer that is shown in FIG. 2 and repeated in FIG. 5b. In this embodiment, a fiber-pigtailed collimator 21 is followed by the sensing polymer film 22 on an appropriate substrate, and then by a mirror 24. In particular, the sensing film 22 can be directly attached to or deposited on the mirror 24. The entire probe can be compactly packaged into a compact housing 25, using modern optical packaging techniques, e.g., used for packaging fiber-pigtailed fiber isolators.

FIG. 6 shows a part of a probe that uses an integration of two single mode fibers 42, 44 and an analyzer/polarizer 46 a and 46 b and an integrated sensing film 48. Two fibers 42, 44 have a core and cladding. At the end of each fiber 42, 44 a portion of the cladding is removed so that two windows are formed in the fibers that face each other. The ends of the fibers 42, 44 are angled polished at 45° and coated with a suitably reflecting material 50, e.g., a metal layer, to form inclined mirrors. Light entering from one fiber 42 is reflected off the angle-polished fiber tip and passes through the analyzer/sensing film/polarizer stack 46 a, b, 48, and is further reflected off the angle-polished fiber tip of the second fiber 44 to continue on the return path.

The present invention also includes within its scope a free-space Sagnac interferometer including a magnetic probe in accordance with embodiments of the present invention. A free-space Sagnac interferometer uses mirrors to direct the light through a gas such as air or a vacuum. The fiber interferometer embodiments may have a somewhat lower sensitivity (by approximately an order of magnitude), but they can be made much more robust, compact and inexpensive. A difference between the free-space Sagnac and a fiber Sagnac sensors can be in the type of a light source that is used: Free-space sensor can utilize a narrow-line laser source, while a broadband LED source is typically used in the fiber version.

Compared with the free-space Sagnac, the fiber Sagnac according to embodiments of the present invention is much more compact and rugged. In principle, it is possible to construct a free-space Sagnac with sensitivity exceeding that of a fiber Sagnac by about an order of magnitude, but the free-space Sagnac will be orders of magnitude more expensive. Thus using the magnetic probes based on the high-Verdet constant materials is a much simpler and more effective way of improving the bottom-line detection limit of the sensor.

In accordance with embodiments of the present invention, magneto-optically active inorganic and/or organic materials are provided. In accordance with some embodiments of the present invention, these materials can be formed into films which transmit light and have a high Verdet constant. One type of material is a polymer matrix loaded with superparamagentic nanoparticles selected so that the material transmits light. Another type of material is based on conjugate polymers which can be loaded with superparamagentic nanoparticles.

Faraday rotation is the rotation of the plane of polarization of linearly polarized light due to magnetic field induced birefringence. The effect has been known for more than a hundred years and is commonly used in optical isolators, for remote sensing of magnetic fields or in magneto-optical imaging. Faraday rotation is at its strongest in inorganic substances containing paramagnetic ions or in superparamagnetic and magnetic materials. For example, Tb Ga garnets are among the most efficient materials known in terms of Faraday rotation. Unfortunately, these materials are often very expensive and difficult to process, they do not allow for miniaturization, or are not suitable for applications at ambient temperatures. The present invention makes use in several embodiments of organic, e.g., polymeric materials for efficient Faraday rotation. A significant advantage of organic materials is their ease of processing, limited weight and the fact that they can be custom-tailored to meet specific requirements. Embodiments of the present invention include conjugated polymers and nanoparticle/polymer blends that have very high Faraday rotation, comparable or even much higher than inorganic materials.

Example 1

Conjugate Polymers

In the first example, the sensing material used is a conjugated polymer, e.g., is a conjugated polymer which can be loaded with superparamagentic nanoparticles. The amount of nanoparticles in the polymer can range from 0.1 to 50 wt %, e.g. 1-10 wt %.

Examples of such polymers are shown below:

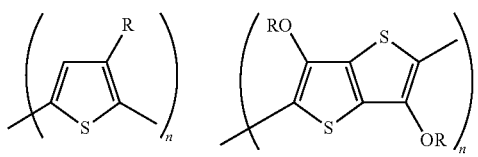

with R as any possible chemical group. However, other conjugated polymers such as poly(acetylene)s, poly(pyrrole)s, poly(aniline)s, poly(fluorene)s, poly(thiophene)s, polytetrathiafulvalenes, polynaphthalenes, poly(p-phenylene sulphide), poly(para-phenylene vinylene)s can be used.

Some experimental values of the Verdet constant of a polyalkoxythiophene are given in the Table below. The Verdet constant was measured at three different wavelengths, i.e., 633 nm, 830 nm and 1550 nm.

|  | 633 nm | 830 nm | 1550 nm |
| --- | --- | --- | --- |
| polythiophene | −2500000°/Tm | −2500000°/Tm | −1000000°/Tm |

Examples of the synthesis of some conjugated polymers for use with the present invention are shown in the schemes below.

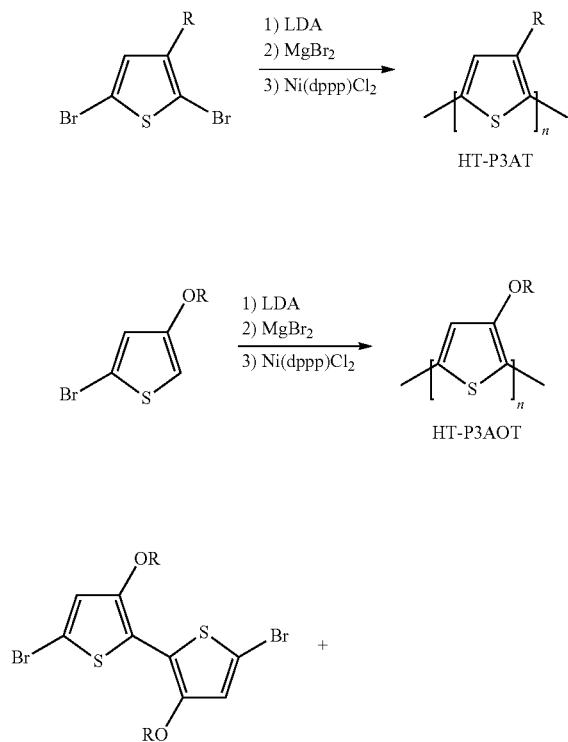

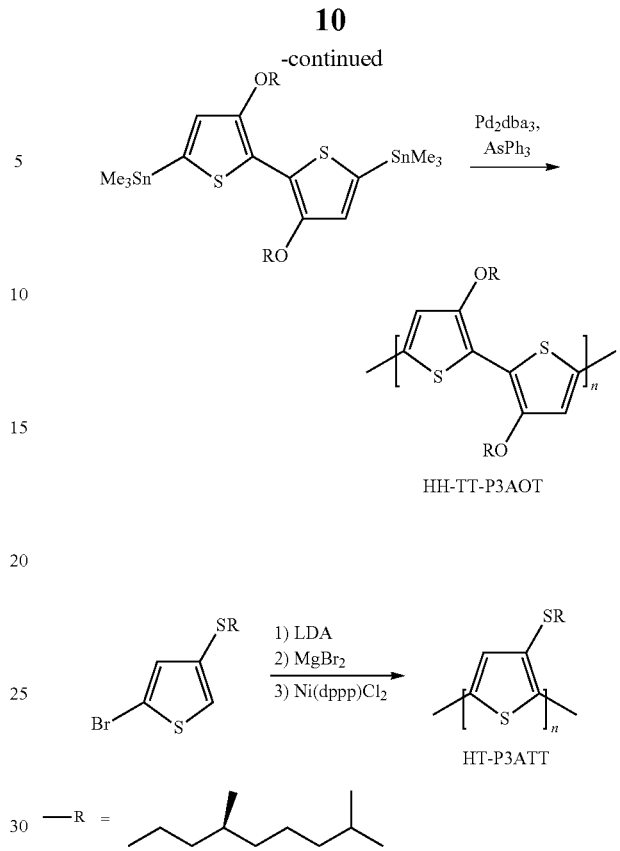

Embodiments of the present invention include regioregular polythiophenes. Materials with superior π-conjugation, electrical communication, and solid state morphology can be prepared by using regiospecific chemical coupling methods that produce >95% 2,5'-couplings of poly(3-alkylthiophenes) (P3AT). The McCullough method synthesizes HT (Head to Tail)-poly(3-alkylthiophenes) (PATs) at or near about 100% couplings. As illustrated below, this method regiospecifically generates 2-bromo-5-(bromomagnesio)-3-alkylthiophene from a monomer, which is polymerized with catalytic amounts of Ni(dppp)Cl$_2$ (1,3-diphenylphosphinopropane nickel(II)chloride) using Kumada cross-coupling methods. The McCullough method can be illustrated as follows:

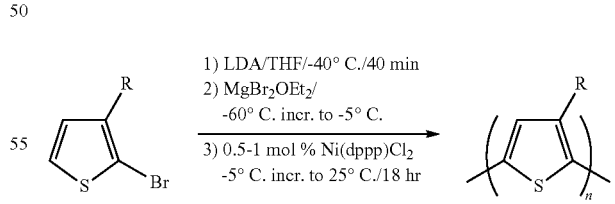

The Rieke method differs from the McCullough method primarily in the synthesis of the asymmetric organometallic intermediate. As illustrated below, a 2,5-dibromo-3-alkylthiophene is added to a solution of highly reactive "Rieke zinc" (Zn*) to form a mixture of the isomers, 2-bromo-3-alkyl-5-(bromozincio)thiophene and 2-(bromozincio)-3-alkyl-5-bromothiophene. The addition of Ni(dppe)Cl.sub.2

(1,2-bis(diphenylphosphino)ethane nickel(II)chloride), a nickel cross-coupling catalyst, leads to the formation of a regioregular HT-PATs. The Rieke method can be illustrated as follows:

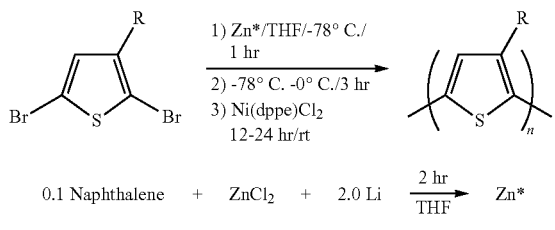

A more practical preparative synthesis of a regio-regular poly(3-substituted thiophene) with alkyl substituents developed by McCullough was effected by condensation of an in situ prepared mono-Grignard (selectively at the 5-position) species of 2-bromo-3-alkylthiophene followed by nickel cross coupling by means of a nickel catalyst. U.S. Pat. No. 6,166,172 discloses a method of forming poly-(3-substituted)thiophene, comprising: providing a soluble thiophene having at least two leaving groups; dissolving the soluble thiophene in a solvent to form a mixture; adding an organomagnesium reagent to the mixture; heating the solution to reflux to form a solution containing a regiochemical isomer intermediate; adding a Ni(II) catalyst to the solution; agitating the solution; and recovering the poly-(3-substituted) thiophene.

Typical syntheses according to the McCullough and 'modified" McCullough methodologies are the GRIM methodologies are given below:

McCullough and 'Modified" McCullough Methodologies:

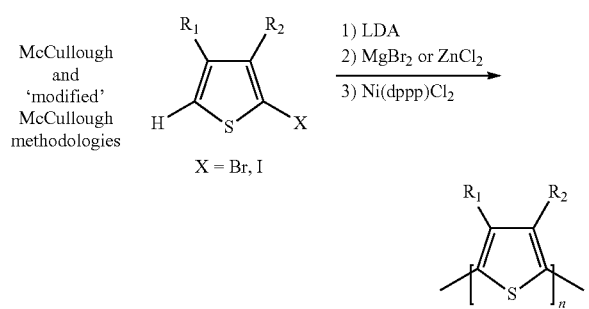

$R_1$ and $R_2$ can be: alkyl, hetero-atom containing alkyl, aryl, substituted aryl, branched alkyl.

Freshly prepared lithium diisopropykamide (LDA) (1.1-2 mmol) is added to a solution of monomer (1.20 mmol) in dry tetahydrofuran (THF) (3 mL) at −78° C. After stirring for 30 min at room temperature, the solution is added to a suspension of magnesium bromide or zinc chloride (1.80 mmol) in dry THF (4 mL) and stirred for another 30 min. Then the reaction mixture is transferred by means of a syringe into a suspension of Ni(dpp)Cl$_2$ in dry THF (7.5 mL). After stirring for 2 h, the polymerization is quenched with HCl (1M in methanol) and the polymer is precipitated into methanol filtered off and dried.

GRIM Methodologies:

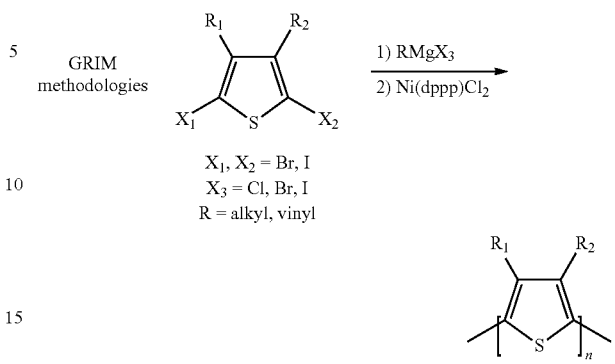

$R_1$ and $R_2$ is typically: alkyl, hetero-atom containing alkyl, aryl, substituted aryl, branched alkyl.

A solution of monomer (0.50 mmol) in dry THF (2.5 mL) is cooled to 0° C. and RMgX$_3$, e.g. iPrMgCl$_3$ (0.50 mmol) is added. The reaction mixture is stirred for 1 h at 0° C. and then transferred by means of a syringe to a suspension of Ni(dpp)Cl$_2$ in dry THF (7.5 mL). After stirring for 2 h, the polymerization is quenched with HCl (1M in methanol) and the polymer is precipitated into methanol filtered off and dried.

Regioselective synthesis of a poly(3-alkylthiophenes) (P3AT) that contains almost exclusively head-to-tail couplings gives polymers exhibiting improved electrical conductivities and a greater effective conjugation length. The introduction of alkyl groups longer than butyl to the 3-position of the thiophene unit yields moderate to high molecular weight materials soluble in common organic solvents. Regio-regular poly(3-substituted thiophenes) with alkyl, aryl, and alkyl/aryl substituents are soluble in common organic solvents. The length of the alkyl side group affects melting point, conductivity etc.

The "defect-free" conjugation in these polymer chains leads to better π-π between-chain overlap and give rise to highly ordered, conducting polymer structures in solid state films. This solid state structural order allows charges to travel freely without being trapped or retarded by defects. Therefore, regioregular HT-PAT films have much higher conductivity than their regiorandom analogs. In fact, HT-PATs represent one of the classes of polymers with the highest electrical conductivity. Furthermore, because of the homogeneity of their 2,5'-ring-to-ring couplings, they exhibit high extinction coefficients for the absorption of visible light corresponding to the π-π absorption for these materials. This absorption determines the quality of the conducting band structure which may be utilized when a regioregular poly(3-substituted thiophene) with alkyl, aryl, or alkyl/aryl substituents is, upon doping, used as in applications requiring highly conductive thin films. Another benefit of the regio-regularity of these materials is that they can self-assemble in the solid state and form well-ordered structures. These structures tend to juxtapose thiophene rings systems through a π-stacking motif and allow for improved inter-chain charge transport through this bonding arrangement between separate polymers, enhancing the conductive properties when compared to regio-random polymers.

Regio-regular poly(3-substituted thiophenes) with alkyl, aryl, and alkyl/aryl substituents and an oxygen atom in the α-position of the 3-substituent, i.e. poly(3-alkoxythiophenes), have also been prepared by the McCullough (nickel cross-coupling of 2-bromo-5-magnesiobromo-3-alkoxythiophene) and GRIM (Grignard metathesis of a 2,5-dibromo-3-alkoxythiophene followed by a nickel cross-coupling reaction) methods. Specific examples of this class of materials include poly(3-substitutedthiophenes) with 2,5-dioxahexyl and 2,5,8-trioxanonyl substituents. In some instances, the 3-substitutent may contain a heteroatom other than oxygen (e.g., "5") in addition to an oxygen atom in the α-position. The amount of regio-regular 2,5'-couplings for these materials exceeds 95%.

Regio-regular poly(3-substitutedthiophenes) with alkyl, aryl, and alkyl/aryl substituents and an oxygen atom in the β-position of the 3-substituent demonstrate the same enhanced performance as other region-regular poly(3-substituted)thiophenes with alkyl, aryl, and alkyl/aryl with regard to processability, defect-free electronic structure, high extinction coefficient, high electronic mobility, improved solid-state morphology. Furthermore, the heteroatom functionality increases the solubility of this material in polar organic solvents like tetrahydrofuran, dimethylformamide (DMF), 1-methoxy-2-propanol acetate (PMA), and chloroform, which enhances the processing options for this material and allowing the selective dissolution of this layer in the presence of other device components.

The presence of impurities, notably metal ions, in this material may have serious deleterious effects on the performance of polythiophene-containing devices. There are several methods by which impurities may be removed from a conjugated polymer. Most of these are facilitated by the ability to dissolve the polymer in common organic and polar solvents. The solubility of these materials facilitates their purification such that they can be made suitable for their application upon doping.

Synthetic methods, doping, and polymer characterization, including regioregular polythiophenes with heteroatoms in the side groups, is provided in, for example, U.S. Pat. No. 6,602,974 and U.S. Pat. No. 6,166,172. Additional description can be found in the article, "The Chemistry of Conducting Polythiophenes," by Richard D. McCullough, Adv. Mat. 10(2), pages 93-116, and references cited therein. In particular, section 4 describes "Chemical Synthesis of Heteroatomic Functionalized Substituents on PTs: Recognition Sites for Self-Assembly and Chemical Sensing." Another reference which one skilled in the art can use is the Handbook of Conducting Polymers, 2nd Ed., 1998, Chapter 9, by McCullough et al., "Regioregular, Head-to-Tail Coupled Poly(3-alkylthiophene) and its Derivatives," pages 225-258, which is hereby incorporated by reference in its entirety. In particular, section VI describes heteroatomic substituents on HT PATs including ether groups and thioalkyl groups.

U.S. Pat. No. 6,602,974 describes conducting regioregular polythiophene block copolymers, including diblock and triblock types, which include as non-thiophene component, for example, polyolefins such as poly(meth)acrylates, polystyrene, and polymethylmethacrylates, and polyurethane elastomers.

Further synthesis examples can be taken from: Regioregularity in Poly(3-alkoxythiophenes): Effects on the Faraday Rotation and polymerization mechanism by G. Koeckelberghs et al., Macromolecular Rapid Communications 27(22), 1920-1925 (2006).

Example 2

Superparamagnetic Nanoparticles

In another example, the sensing element is a polymer doped with superoparamagnetic nanoparticles. The polymer may be a conjugate polymer as disclosed above. However the present invention is not limited thereto but includes the use of transparent polymers loaded with superparamagentic nanoparticles. The polymer forming then matrix can be any suitable transparent polymer such as PMMA, polyethylene, polypropylene, polycarbonate, ABS, PVC, PVA, polyimide, polystyrene, etc., or a conjugate polymer as described with reference to this invention. The amount of nanoparticles in the polymer can range from 0.1 to 50 wt %, e.g., 1-10 wt % or 1 to 20 wt %.

The material can be formed into a film. The film can be made by any suitable method, e.g., compression molding, extrusion, spin coating, doctor blading, powder coating, etc. The material in film form will transmit light. In order to make the film translucent or transparent it is preferable if the particles have a dimension smaller than the wavelength of the light used with the sensor. The shape of the nanoparticles can be cylindrical, spherical, triangular or any other shape with dimensions of the order of 1 to 1000 nm. The nanoparticles can be iron oxides, Cobalt, Nikkel, cobalt ferrites on any other system that exhibits superparamagnetic behaviour. The amount of nanoparticles in the polymer can range from 0.1 to 50 wt %, e.g., 1-10 wt %. The polymer matrix is typically polymethylmethcrylate (PMMA), but can be any suitable polymer, including conducting polymers, that is able to disperse the nanoparticles.

In order to increase the Verdet constant, the polymer/nanoparticle blends can be poled by an external magnetic field. For this, the polymer with nanoparticles is heated close to its glass transition temperature and placed in an external magnetic field. The nanoparticles will now align according to the field lines of the magnet. Upon cooling down in the presence of the field, the orientation of the nanoparticles is frozen in. As a result of the poling, the Verdet constant of the material is improved, as well the transparency.

The particles may also be aligned by other means, e.g., mechanical means. Rod-shaped particles can be used, and incorporated into a plastic matrix. This material can then be extruded into film and optionally stretched in order to align the particles.

The material forming the particles may optionally be doped. Suitable doping materials are transition metals, rare earths especially lanthanoids, for example doping with dysprosium, gadolinium, terbium, erbium, etc. The amount of doping is typically less than 10 wt %, e.g., 6 wt %, 5 wt %, 4 wt %, 3 wt %, 2 wt % or 1 wt %.

Experimental results are shown below. The sample was a spincoated film of a blend of ironoxide nanoparticles with polyisobutylmethacrylate on a glass substrate. Poling was done in two ways: poling in the plane of the substrate (parallel poling) or perpendicular to the substrate. The Verdet constant of the unpoled film was $3.4 \cdot 10^{5}$°/Tm. Poling increased the Verdet constant by a factor of 2 in when poling was done in the plane of the film and by a factor of 10 when poling was done perpendicular to the film plane.

|  | Not poled | parallel or perpendicular poled |
|---|---|---|
| $Fe_3O_4$ nanoparticles, 5 wt % in polyisobuthylmethacrylate | $3.4 \cdot 10^{5}$°/Tm | $3.6 \cdot 10^{6}$°/Tm<br>$7.4 \cdot 10^{7}$°/Tm |

To obtain the highest Verdet constants it may be necessary to combine aspects of the present invention, e.g., to use doped superparamagnetic particles in a polymer matrix, and to pole and align the particles. It may also be necessary to use a conjugate polymer as the polymer matrix or as a component of the polymer matrix.

If this is done the Verdet constant of nanoparticle based materials in a polymer matrix can be made in the range: $10^6$ to $10^9°/Tm$, e.g., $10^6$ to $10^8°/Tm$.

A typical synthesis of the nanoparticles is as follows:

Fe (III)chloride was dissolved in ethylene glycol in the presence of octylamine that acts as a stabilizer. The mixture was heated to 180° C., and kept at that temperature for 24 h. The nanoparticles of $Fe_3O_4$ that were formed were purified by magnetic filtration. The size of the resulting nanoparticles is typically between 9 and 40 nm, depending on the stabilizer used.

Cobalt ferrite nanoparticles can be synthesized by the same procedure, but in that case a small amount of cobalt chloride was added to the reaction mixture.

A synthesis of superparamagnetic magnetic nanoparticles is given below: Add 37.5 mL ethylene glycol and 25 mL octylamine in a 100 mL round-bottomed flask with 2 or 3 necks. Heat the mixture with constant stirring up to 150° C. Dissolve 2.4 g of iron(III)chloride in 10 mL ethylene glycol and 4 mL distilled water. Add the dissolved iron(III)chloride dropwise into the hot octylamine-ethylene glycol mixture. Keep stirring the mixture and heat further until reflux (180-190° C.) for 18-24 hours. Finally purify the particles by magnetic filtration.

The octylamine and ethylene glycol may combine to form a surfactant which stabilizes the superparamagnetic magnetite nanoparticles.

The shape of the superparamagnetic nanoparticles can be cylindrical, spherical, triangular or any other shape with dimensions of the order of 1 to 1000 nm. The nanoparticles can be iron oxides, cobalt, nickel cobalt ferrites or any other system that exhibits superparamagnetic behaviour. Yu. A. Barnakov et al. in 2004 in Journal of Physics and Chemistry of Solids Volume 65, pages 1005-1010 reported that Faraday rotation spectra measured on superparamagnetic nanoparticles in a poly(methylmethacrylate matrix) exhibited a broad spectral band centred at 650 nm (1.91 eV) for 200 nm-sized nanoparticles. Decreasing the particle size leads to a significant narrowing of this band and the appearance of an additional peak in the 2.5-3.2 eV range.

Alternatively superparamagnetic magnetite nanoparticles can be prepared by removing oxygen from a 3-necked flask with nitrogen gas inside a glove box. Mix iron(III)chloride, iron(II)chloride tetrahydrate, nanopure water and ammonium hydroxide and heat to give a murky solution. Settle the murky solution over a permanent magnet, remove the clear supernatant liquid, wash and dry to give black superparamagnetic magnetite nanoparticles with a particle size of 7.88 nm. Free amine ($-NH_2$) groups encompass the magnetite nanoparticles. The exact nature of the bonding has not yet been clearly understood.

Figure 7:
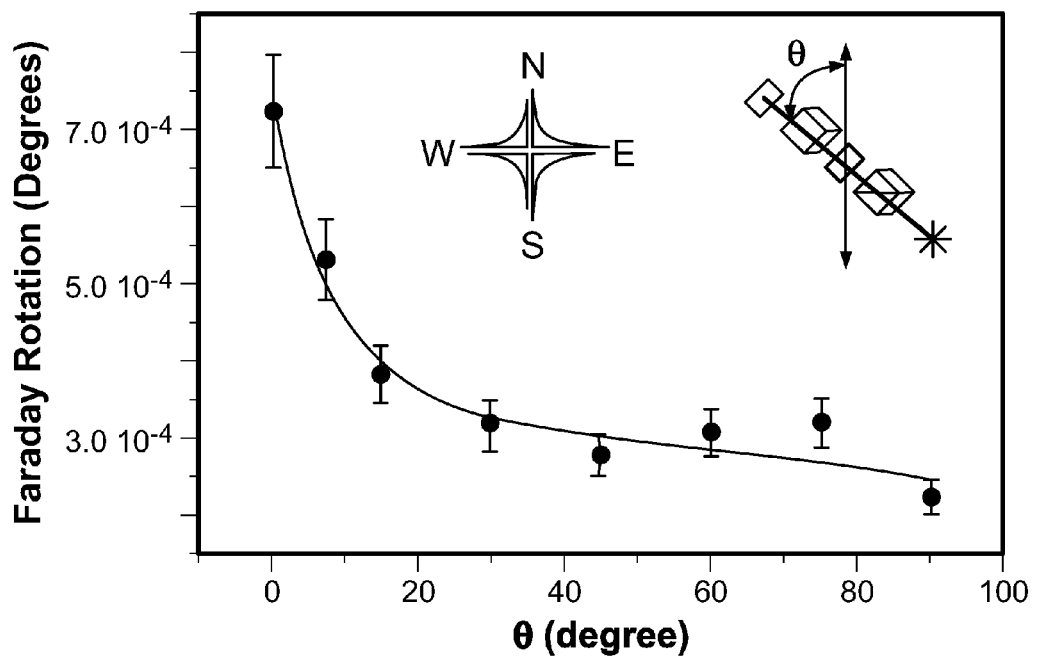
FIG. 7 shows results of measuring the earth's magnetic field using an embodiment of a sensor in accordance with the present invention.

To illustrate the sensitivity of the polymeric materials, we have measured Faraday rotation, due to the magnetic field of the earth, in a thin film of a polyalkoxythiophene. The results are shown in FIG. 7. As can be seen the Faraday rotation is sensitive to the direction between earth's magnetic field and the direction of light propagation ($\theta$). When the earth's magnetic field is parallel with the light propagation ($\theta=0$), Faraday rotation is maximum. On the other hand, when the magnetic field is perpendicular to the propagation direction, Faraday rotation is minimum.

In the Table below a comparison is provided of the Verdet constant of Tb Ga garnets (inorganic) compared with that of conjugated polymer and nanoparticle/polymer blends according to embodiments of the present invention.

|  | Tb Ga Garnet Iron garnets (BIG, YIG, . . . ) | Conjugated polymer (polythiophene) | Nanoparticle/ polymer blend |
| --- | --- | --- | --- |
| Verdet constant (°/Tm) | 5000-1000000 | $10^6$-$10^7$ | $10^7$-$10^9$ |

Advantages of embodiments of the present invention comprise at least one of the following:

1) Faraday rotation in inorganic materials has been used frequently to measure magnetic fields. However, the Verdet constant of inorganic materials is usually low (<$10^6°/Tm$), or the material suffers from poor transparency. As a consequence, the sensitivity of the Faraday sensor is limited. Organic materials, or blends of inorganic nanoparticles with organic polylmers as described with respect to embodiments of the present invention can have much higher Verdet constants (>$10000°/Tm$). Furthermore, they are often much more transparent, leading to a Faraday sensor that is much more sensitive.

2) Embodiments of the present invention provide an economical replacement of expensive SQUID magnetometers. The magneto-optical organic materials used to form polymer-based devices according to embodiments of the present invention are much more robust, compact, inexpensive, and will not require cryogenic cooling.

3) The magneto-optically active organic materials such as polymers according to embodiments of the present invention result in devices with the sensitivity potentially exceeding that of SQUIDs.

4) There are two main advantages of the passively biased sensor compared to the lock-in based version:

Firstly, the detection bandwidth of the passively biased sensor is limited only by the time of flight of light through the optical circuit. Thus, in principle, the bandwidth can be as high as 100 MHz or even higher. In comparison, the detection bandwidth of the lock-in sensor cannot be higher than the modulation frequency. In fact, the bottom-line bandwidth is at least an order of magnitude lower than that.

Secondly, the passively biased version is much simpler and more low-cost because it does not require an optical phase modulator and sophisticated phase detection electronics.

REFERENCES

T. Verbiest, S. Foerier, M. Vangheluwe, A. Persoons, G. Koeckleberghs, P. Gangopadhyay, SPIE proceedings 2006, 6331, Paper 34

G. Koeckelberghs, M. Vangheluwe, K. Van Doorsselaere, E. Robijns, A. Persoons, T. Verbiest, Regioregularity in poly(3-alkoxythiophene)s: Effects on the Faraday rotation and polymerization mechanism, Macromolecular Rapid Communications, 27, p. 1920-1925, 2006

R. de Carvalho, J. Blake, and G. Sanders, "Sagnac interferometry for measurements of true nonreciprocal effects," in *Proc. SPIE* 2070, 1993, pp. 264-269.

J. Blake, P. Tantaswadi, and R. T. de Carvalho, "In-line Sagnac interferometer current sensor," *IEEE Trans. Power Delivery*, vol. 11, pp. 116-121, 1996.

G. Frosio and R. Dändliker, "Reciprocal reflection interferometer for a fiber-optic Faraday current sensor," *Appl. Opt.*, vol. 33, no. 25, pp. 6111-6122, 1994.

What is claimed:

1. A magnetic sensor probe comprising:
an input fiber for coupling in light,
an output fiber for coupling out light,
an organic magneto-optically active film which is arranged to transmit the light received by the magnetic sensor probe to and from optical components that direct the light from the input fiber, through the organic magneto-optically active film to the output fiber,
wherein the magneto-optically active film comprises a polymer having a Verdet constant $>10^{6}°$/Tm, and
wherein the polymer includes superparamagnetic particles, which are iron oxides, cobalt, nickel cobalt ferrites.

2. The magnetic sensor probe according to claim 1, wherein the optical components include a fiber-pigtailed collimator, and a mirror, the organic magneto-optically active film being arranged between the collimator and the mirror.

3. The magnetic sensor probe according to claim 2, wherein the organic magneto-optically active film is attached or deposited on the mirror.

4. The magnetic sensor probe according to claim 1, wherein the magneto-optically active film is integrated into a reflective termination of the input and output fibers.

5. The magnetic sensor probe according to claim 2, wherein the organic magneto-optically active film is integrated into a reflective termination of the input and output fibers.

* * * * *